(12) United States Patent
Kim

(10) Patent No.: US 8,101,482 B2
(45) Date of Patent: Jan. 24, 2012

(54) METHOD OF FABRICATING SEMICONDUCTOR DEVICE HAVING TRANSISTOR

(75) Inventor: Young-Mok Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 17 days.

(21) Appl. No.: 12/656,544

(22) Filed: Feb. 3, 2010

(65) Prior Publication Data

US 2010/0197090 A1 Aug. 5, 2010

(30) Foreign Application Priority Data

Feb. 3, 2009 (KR) .................. 10-2009-0008575

(51) Int. Cl.
*H01L 21/8242* (2006.01)

(52) U.S. Cl. . 438/243; 438/232; 438/256; 257/E21.651; 257/E21.428

(58) Field of Classification Search .................. 438/232, 438/243, 259, 256, 270, 542; 257/E21.651, 257/E21.428
See application file for complete search history.

(56) References Cited

U.S. PATENT DOCUMENTS

| 5,298,780 | A | | 3/1994 | Harada | |
|---|---|---|---|---|---|
| 6,214,670 | B1 | * | 4/2001 | Shih et al. | 438/259 |
| 6,802,719 | B2 | * | 10/2004 | Finney | 438/270 |
| 6,916,712 | B2 | * | 7/2005 | Kocon et al. | 438/270 |
| 7,078,296 | B2 | * | 7/2006 | Chau et al. | 438/270 |
| 7,319,255 | B2 | * | 1/2008 | Hwang et al. | 257/330 |
| 7,589,995 | B2 | * | 9/2009 | Tang et al. | 365/174 |
| 2002/0024091 | A1 | * | 2/2002 | Mo | 257/330 |
| 2006/0263979 | A1 | * | 11/2006 | Nejad et al. | 438/256 |
| 2007/0007571 | A1 | * | 1/2007 | Lindsay et al. | 257/306 |
| 2007/0048930 | A1 | * | 3/2007 | Figura et al. | 438/243 |
| 2008/0135907 | A1 | * | 6/2008 | Lin et al. | 257/302 |
| 2008/0280406 | A1 | * | 11/2008 | Ema et al. | 438/210 |
| 2009/0127624 | A1 | * | 5/2009 | Sumitomo et al. | 257/350 |
| 2010/0006913 | A1 | * | 1/2010 | Lin et al. | 257/301 |
| 2010/0075471 | A1 | * | 3/2010 | Kim | 438/151 |
| 2010/0155837 | A1 | * | 6/2010 | Hebert | 257/334 |
| 2010/0289077 | A1 | * | 11/2010 | Kim | 257/334 |

FOREIGN PATENT DOCUMENTS

| JP | 05-226661 | 9/1993 |
|---|---|---|
| JP | 2003-298048 | 10/2003 |
| KR | 10-2008-0003055 | 1/2008 |

* cited by examiner

*Primary Examiner* — Walter L Lindsay, Jr.

(74) *Attorney, Agent, or Firm* — Harness, Dickey & Pierce, P.L.C.

(57) ABSTRACT

Provided is a method of fabricating a semiconductor device having a transistor. The method includes forming a first gate trench in a first active region of a semiconductor substrate. A first gate layer partially filling the first gate trench is formed. Ions may be implanted in the first gate layer and in the first active region on both sides of the first gate layer such that the first gate layer becomes a first gate electrode of a first conductivity type and first impurity regions of the first conductivity type are formed on both sides of the first gate electrode.

19 Claims, 9 Drawing Sheets

METHOD OF FABRICATING SEMICONDUCTOR DEVICE HAVING TRANSISTOR

CROSS-REFERENCE TO RELATED APPLICATION

This application claims the benefit of priority under 35 U.S.C. §119 to Korean Patent Application No. 10-2009-0008575, filed on Feb. 3, 2009, in the Korean Intellectual Property Office (KIPO), the entire contents of which are hereby incorporated by reference.

BACKGROUND

1. Field

Example embodiments relate to a semiconductor device, and more particularly, to a method of fabricating a semiconductor device having a transistor.

2. Description of Related Art

In general, high-voltage MOS transistors are required to be designed to have a high breakdown voltage, and thus, scaling down the high-voltage MOS transistors may be difficult.

SUMMARY

Inventive concepts of the example embodiments relate to a method of fabricating a semiconductor device having a high-voltage transistor capable of improving integration density.

According to an example embodiment, a method of fabricating a semiconductor device includes forming a first gate trench in a first active region of a semiconductor substrate, forming a first gate layer partially filling the first gate trench and first implanting ions in the first gate layer and in the first active region on both sides of the first gate layer such that the first gate layer becomes a first gate electrode of a first conductivity type and first impurity regions of the first conductivity type are formed on both sides of the first gate electrode.

In an example embodiment, before implanting the ions, the method may further include forming a spacer insulating layer on the entire surface of the semiconductor substrate having the first gate layer; and forming a first spacer on an upper sidewall of the first gate trench by removing at least a portion of the spacer insulating layer. The spacer insulating layer includes at least one of a silicon oxide layer, a silicon oxynitride (SiON) layer and a silicon nitride layer.

In an example embodiment, the method may further include forming a first buffer region in the first active region before forming the first gate trench, wherein the first buffer region has the same conductivity type as the first impurity regions and has a lower impurity concentration than the first impurity regions. Forming the first gate layer may include forming a first gate layer material on the semiconductor substrate having the first gate trench, the first gate layer material including at least one of a silicon (Si) layer, a germanium (Ge) layer and a SiGe layer; and removing at least a portion of the first gate layer material. The first conductivity type may be an N-type or a P-type.

In an example embodiment, the method may further include forming a second gate trench in a second active region of the semiconductor substrate while the first gate trench is formed; forming a second gate layer partially filling the second gate trench while the first gate layer is formed; and second implanting ions in the second gate layer and in the second active region on both sides of the second gate layer such that the second gate layer becomes a second gate electrode of a second conductivity type different from the first gate electrode and second impurity regions of the second conductivity type are formed on both sides of the second gate electrode, wherein the first implanting may be performed for simultaneously forming the first gate electrode and the first impurity regions, wherein the second implanting maybe performed for simultaneously forming the second gate electrode and the second impurity regions.

In an example embodiment, the method may further include forming an isolation region in the semiconductor substrate to define the first and second active regions before forming the first and second gate trenches.

In an example embodiment, the method may further include forming a first buffer region in the first active region before forming the first and second gate trenches, wherein the first buffer region has the same conductivity type as the first impurity regions and has a lower impurity concentration than the first impurity regions; and forming a second buffer region in the second active region before or after forming the first buffer region, wherein the second buffer region has the same conductivity type as the second impurity regions and has a lower impurity concentration than the second impurity regions. The method may further include forming a well region in the second active region, the well region having a conductivity type different from the conductivity type of the second buffer region.

In an example embodiment, before implanting the ions, the method may further include forming a spacer insulating layer on the entire surface of the semiconductor substrate having the second gate layer; and forming a second spacer on an upper sidewall of the second gate trench by removing at least a portion of the spacer insulating layer.

In an example embodiment, the method may further include forming a first gate dielectric layer on the semiconductor substrate in the first active region having the first gate trench before forming the first gate layer and forming a second gate dielectric layer on the semiconductor substrate in the second active region having the second gate trench before forming the second gate layer.

In an example embodiment, the method may further include forming a third active region in the semiconductor substrate; forming a third gate layer on the third active region of the semiconductor substrate while the first and second gate layers are formed; and implanting ions in the third gate layer and in the third active region on both sides of the third gate layer such that the third gate layer becomes a third gate electrode and third impurity regions are formed on both sides of the third gate electrode. The method may further include forming a third gate dielectric layer on the semiconductor substrate in the third active region before forming the third gate layer.

In an example embodiment, before implanting the ions, the method may further include forming a spacer insulating layer on the entire surface of the semiconductor substrate having the third gate layer; and forming a third spacer on sidewalls of the third gate layer by removing at least a portion of the spacer insulating layer. The method may further include forming an isolation region in the semiconductor substrate to define the first, second and third active regions before forming the first and second gate trenches.

In an example embodiment, the method may further include forming a first ion implantation mask configured to cover the second and third active regions and expose the first active region; and implanting first impurities into the first active region using the first ion implantation mask as a photoresist. In an example embodiment, the method may further include forming a second ion implantation mask configured to cover the first active region and expose the second and third active regions; and implanting second impurities into the second and third active regions using the second ion implantation mask as a photoresist. The semiconductor substrate may be made of silicon.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
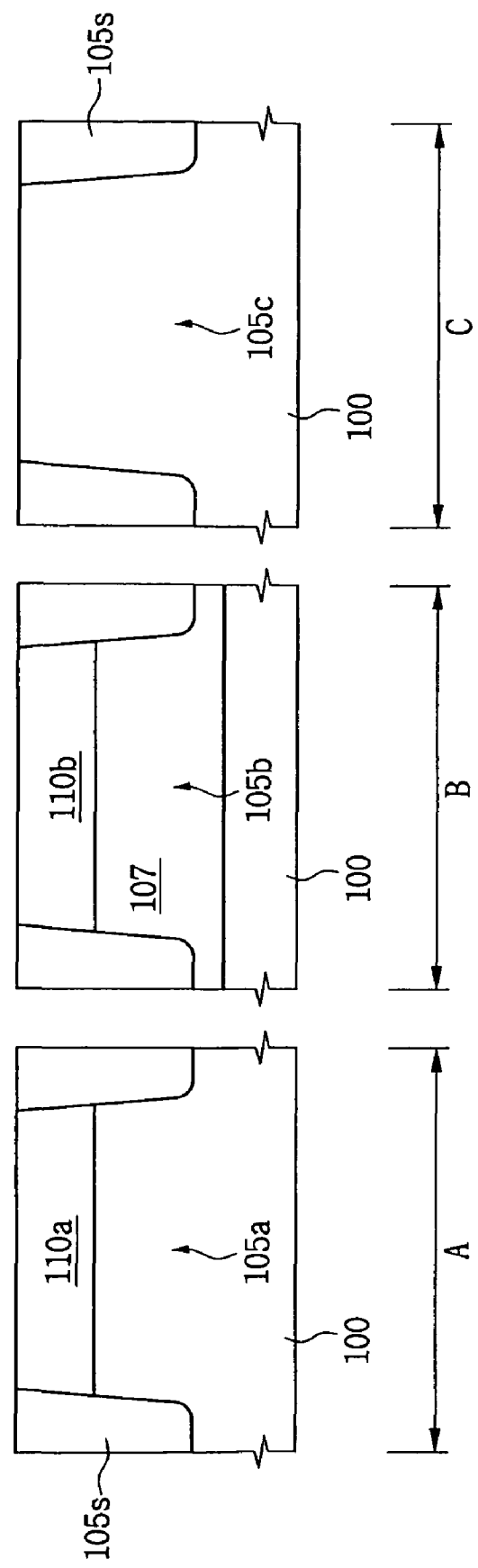
FIGS. 1 to 9 are cross-sectional views of a semiconductor device according to example embodiments of the inventive concepts.

Various example embodiments will now be described more fully with reference to the accompanying drawings in which some example embodiments are shown. The inventive concepts may, however, be embodied in different forms and should not be construed as limited to the example embodiments set forth herein. Rather, these example embodiments are provided so that this disclosure is thorough and complete and fully conveys the scope of the inventive concepts to one skilled in the art. In the drawings, the thickness of layers and regions may be exaggerated for clarity. Also, when it is referred that a layer is "on" another layer or a substrate, it may be directly formed on another layer or the substrate or a third layer may be interposed therebetween. Like reference numerals designate like elements throughout the specification.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 9 are cross-sectional views of a semiconductor device according to example embodiments. In FIGS. 1 to 9, a part represented by "A" denotes a first device region, a part represented by "B" denotes a second device region, and a part represented by "C" denotes a third device region.

Referring to FIG. 1, a substrate 100 is prepared. The substrate 100 may be a semiconductor wafer such as silicon. The substrate 100 may have a first conductivity type. The first conductivity type may be an N-type or a P-type. The second device region B may have a well region 107 of a second conductivity type different from the first conductivity type.

An isolation region 105s defining active regions 105a, 105b and 105c of the substrate 100 may be formed. More specifically, the isolation region 105s may define a first active region 105a of the first device region A, a second active region 105b of the second device region B, and a third active region 105c of the third device region C. The isolation region 105s may be formed using a trench isolation technique.

A first buffer region 110a may be formed in the first active region 105a. The first buffer region 110a may have a different conductivity type from the first active region 105a. For example, the first active region 105a may exhibit a P-type, and the first buffer region 110a may exhibit an N-type. Forming the first buffer region 110a may include exposing the first active region 105a, forming a photoresist pattern (not shown) covering the second and third active regions 105b and 105c, and implanting impurities into the first active region 105a using the photoresist pattern as an ion implantation mask.

A second buffer region 110b having a different conductivity type from the well region 107 may be formed in the second active region 105b. Forming the second buffer region 110b may include forming a photoresist pattern exposing the second active region 105b and covering the first and third active regions 105a and 105c, and implanting impurities into the second active region 105b using the photoresist pattern as an ion implantation mask. The second buffer region 110b may be formed after the first buffer region 110a is formed. Alternatively, the second buffer region 110b may be formed before the first buffer region 110a is formed.

Figure 2:
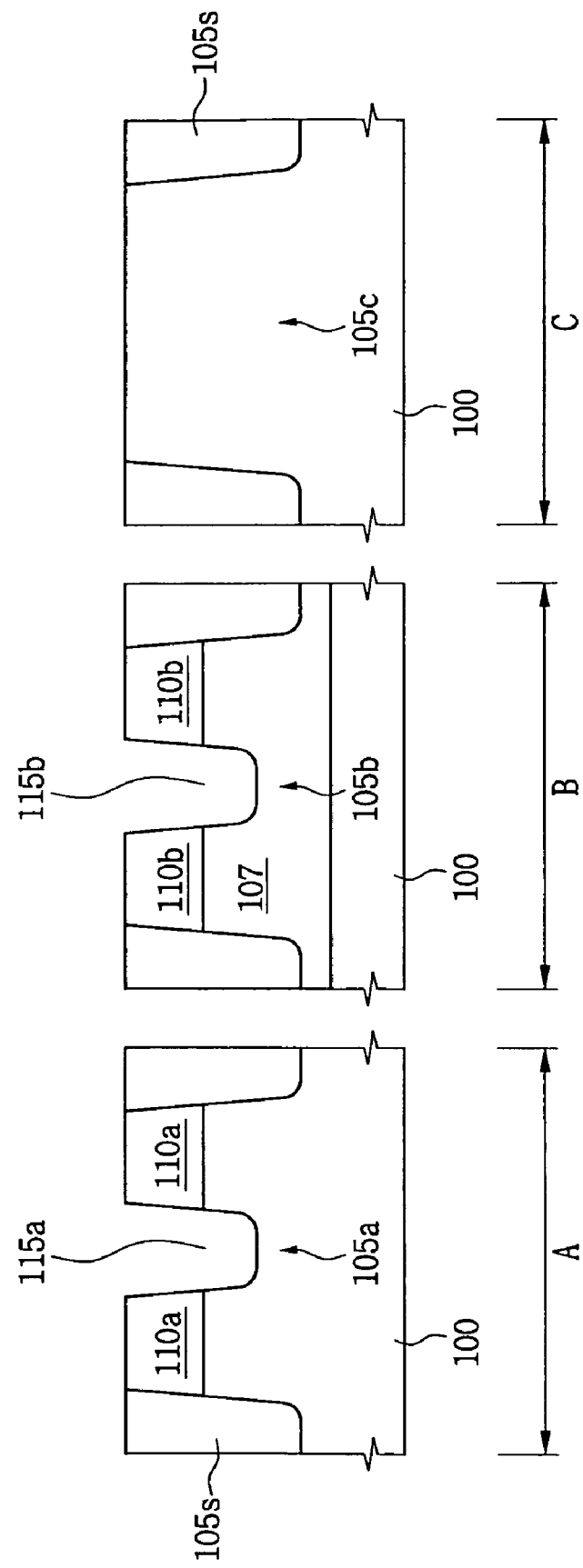

Referring to FIG. 2, a first gate trench 115a crossing the first active region 105a may be formed, and a second gate trench 115b crossing the second active region 105b may be formed. For example, forming the first and second gate trenches 115a and 115b may include forming a mask pattern (not shown) having openings exposing predetermined or given regions of the first and second active regions 105a and 105b, etching the first and second active regions 105a and 105b using the mask pattern as an etch mask, and removing the mask pattern.

The first and second gate trenches 115a and 115b may be formed to penetrate the first and second buffer regions 110a and 110b. That is, bottom surfaces of the first and second gate trenches 115a and 115b may be disposed at a lower level than the first and second buffer regions 110a and 110b.

Figure 3:
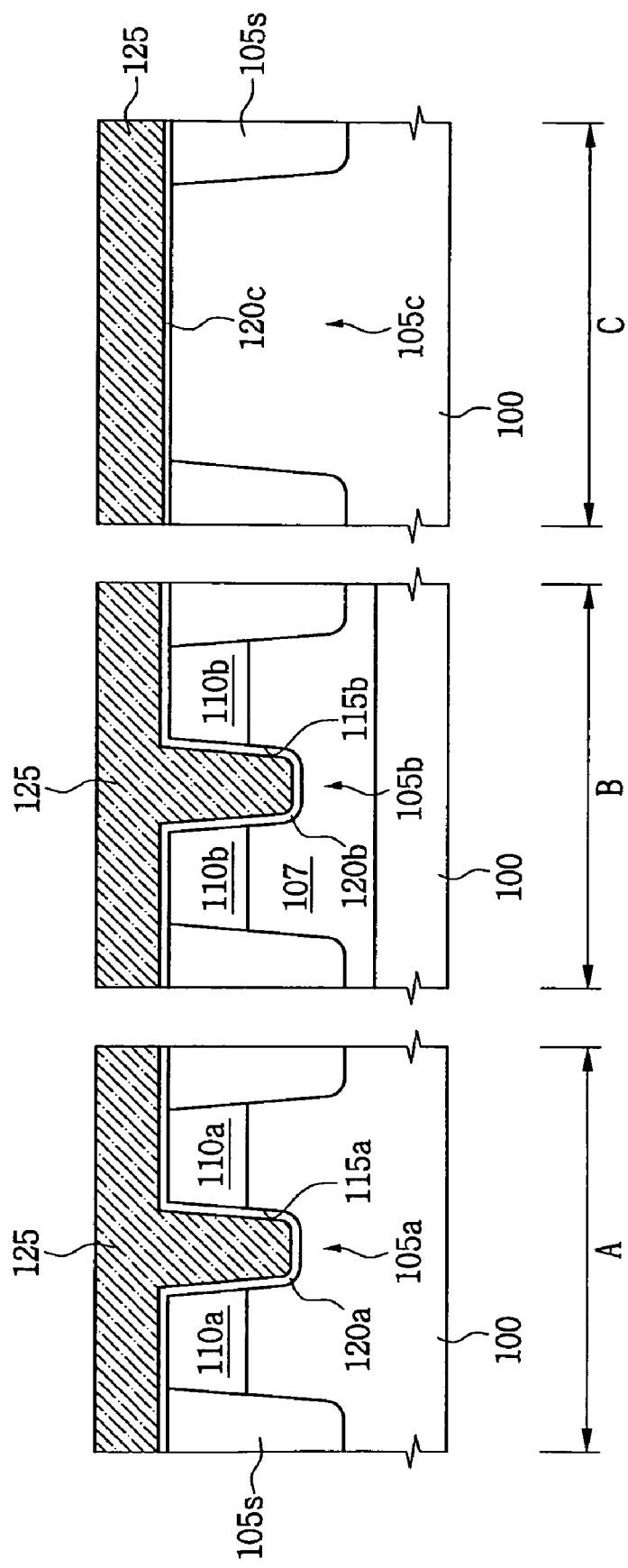

Referring to FIG. 3, a first gate dielectric layer 120a may be formed on the first active region 105a, in which the first gate trench 115a is formed. A second gate dielectric layer 120b may be formed on the second active region 105b, in which the second gate trench 115b is formed. A third gate dielectric layer 120c may be formed on the third active region 105c. The first to third gate dielectric layers 120a, 120b and 120c may be formed of the same dielectric material or at least two dielectric layers may be formed of different dielectric materials.

For example, the first and second gate dielectric layers 120a and 120b may be formed to a first equivalent thickness, and the third gate dielectric layer 120c may be formed to a second equivalent oxide thickness smaller than the first equivalent oxide thickness. A gate layer 125 may be formed on the substrate having the first to third gate dielectric layers 120a, 120b and 120c. For example, the gate layer 125 may include at least one of a silicon (Si) layer, a germanium (Ge) layer and a SiGe layer.

Figure 4:
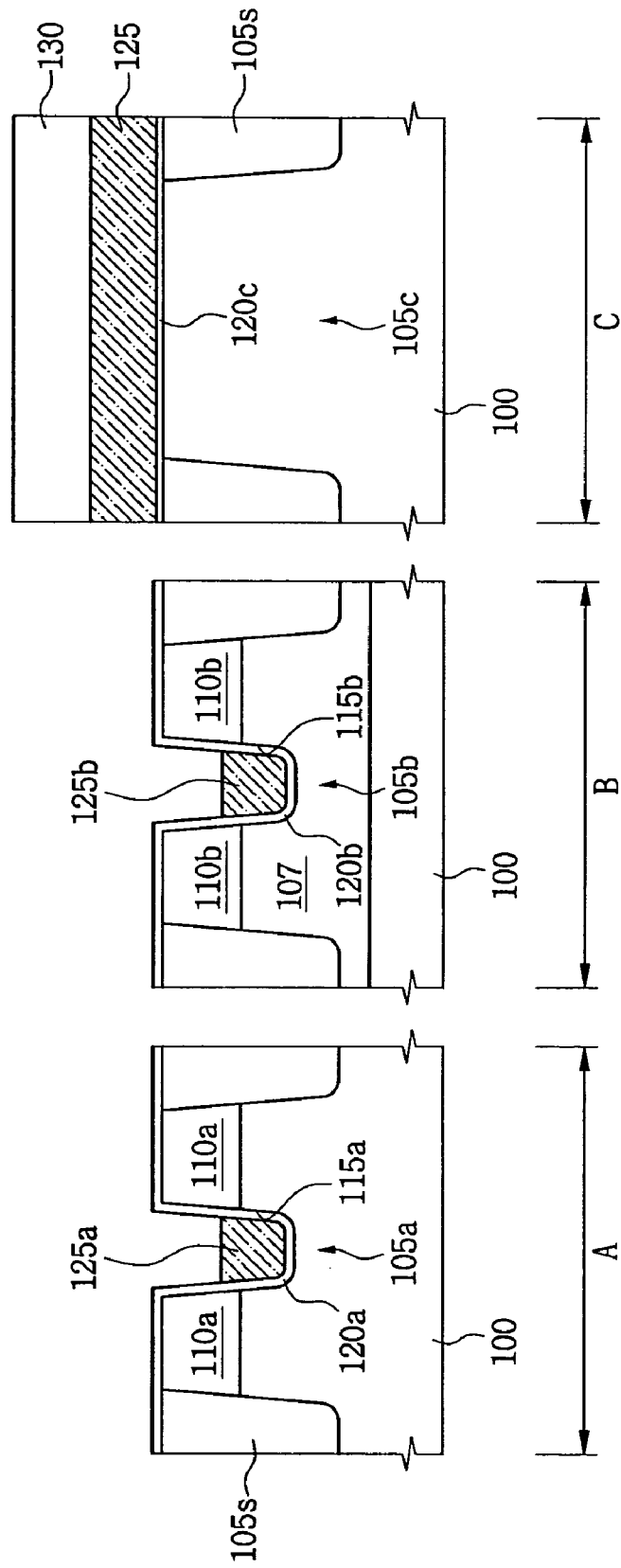

Referring to FIG. 4, a gate mask pattern 130 covering the gate layer 125 on the third device region C, and exposing the gate layer on the first and second device regions A and B may be formed. The gate mask pattern 130 may be formed of a photoresist material.

The gate layer 125 on the first and second device regions A and B may be etched using the gate mask pattern 130 as an etch mask, so that a first gate layer 125a partially filling the first gate trench 115a may be formed, and a second gate layer 125b partially filling the second gate trench 115b may be formed. Top surfaces of the first and second gate layers 125a and 125b may be formed on a higher level than bottom surfaces of the first and second buffer regions 110a and 110b. Alternatively, the top surfaces of the first and second gate layers 125a and 125b may be formed on substantially the same level as the bottom surfaces of the first and second buffer regions 110a and 110b.

Figure 5:
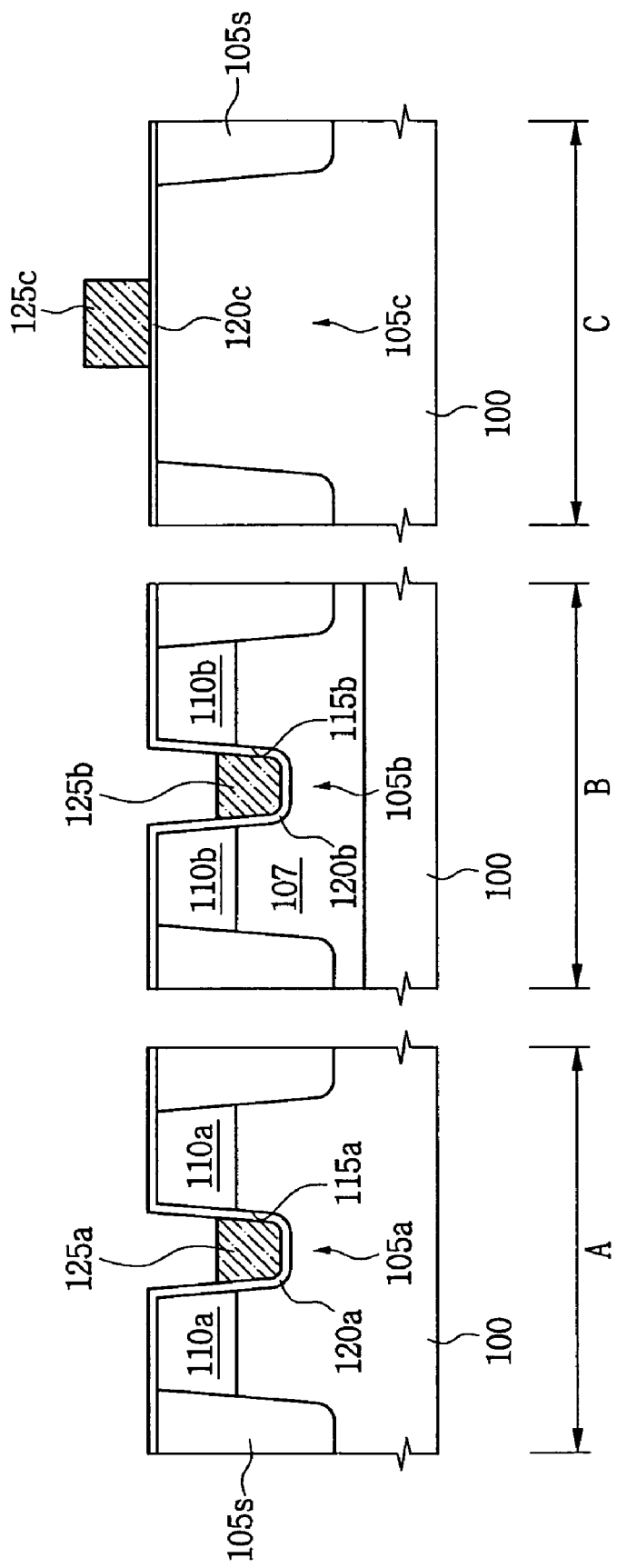

Referring to FIG. 5, the gate mask pattern (130 of FIG. 4) may be removed. The gate layer (125 of FIG. 4) on the third device region may be patterned to form a third gate layer 125c. In example embodiments, a process of forming a photoresist pattern for forming the third gate layer 125c and a process of etching for simultaneously forming the first to third gate layers 125a, 125b and 125c may be performed. That is, photolithography for simultaneously forming the first to third gate layers 125a, 125b and 125c may be performed.

Figure 6:
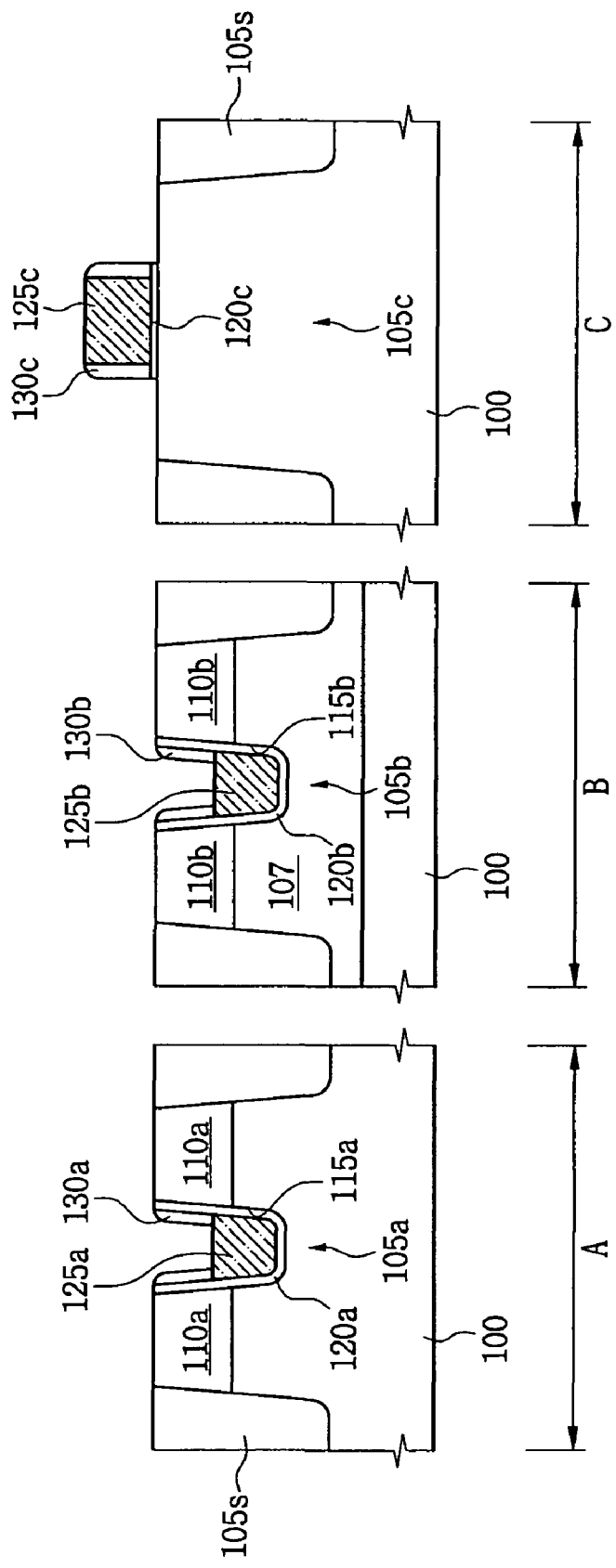

Referring to FIG. 6, a spacer insulating (not shown) layer may be formed on the substrate having the first to third gate layers 125a, 125b and 125c, and the spacer insulating layer may be anisotropically etched to form first to third spacers 130a, 130b and 130c. The spacer insulating layer may include at least one of a silicon oxide layer, a silicon oxynitride (SiON) layer and a silicon nitride layer. For example, the spacer insulating layer may be formed of medium temperature deposition of oxide (MTO) and a silicon nitride layer, which are sequentially stacked.

The first spacer 130a may be formed on a sidewall of the first gate trench 115a, which is not filled with the first gate layer 125a. For example, the first spacer 130a may be formed on an upper sidewall of the first gate trench 115a. Likewise, the second spacer 130b may be formed on a sidewall of the second gate trench 115b, which is not filled with the second gate layer 125b. The third spacer 130c may be formed on a sidewall of the third gate layer 125c.

Figure 7:
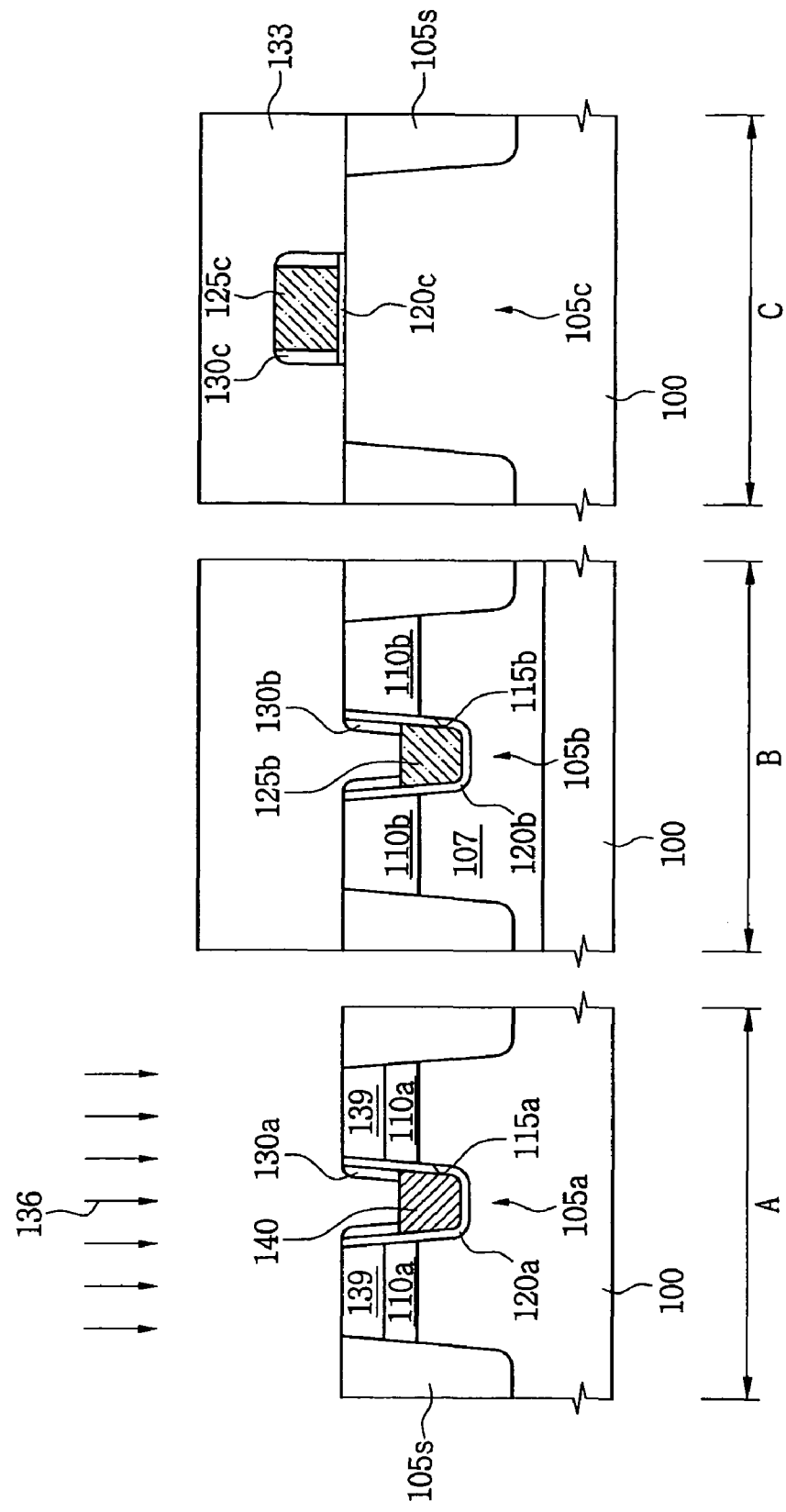

Referring to FIG. 7, a first ion implantation mask 133 exposing the first device region A and covering the second and third device regions B and C may be formed. The first ion implantation mask 133 may be formed using a photoresist layer.

Afterwards, a first ion implantation process 136 may be performed to implant first impurities into the first gate layer (125a of FIG. 6) exposed by the first ion implantation mask 133, and the first active region 105a. As a result, first impurity regions 139 may be formed in the first active regions 105a at both sides of the first gate layer (125a of FIG. 6), and the first gate layer (125a of FIG. 6) may be formed as a first gate electrode 140. That is, the first impurity regions 139 and the first gate electrode 140 may be formed to have the same conductivity type by the first ion implantation process 136. Also, the first gate layer (125a of FIG. 6) may be formed as a high-concentration first gate electrode 140.

Bottom regions of the first impurity regions 139 may be formed on a higher level than a top surface of the first gate electrode 140. The first impurity regions 139 may have the same conductivity type as the first buffer regions 110a. Also, the first impurity regions 139 may have a higher impurity concentration than the first buffer regions 110a. The first impurity and buffer regions 139 and 110a may exhibit N-type conductivity. In contrast, the first impurity and buffer regions 139 and 110a may have a P-type conductivity. The first impurity regions 139 may be defined as a source/drain of a transistor, and the buffer region 110a may be defined as an extension part of the source/drain. The first spacer 130a may prevent or reduce damage to the first gate dielectric layer 120a between the first gate electrode 140 and the first active region 105a during the first ion implantation process 136.

Figure 8:
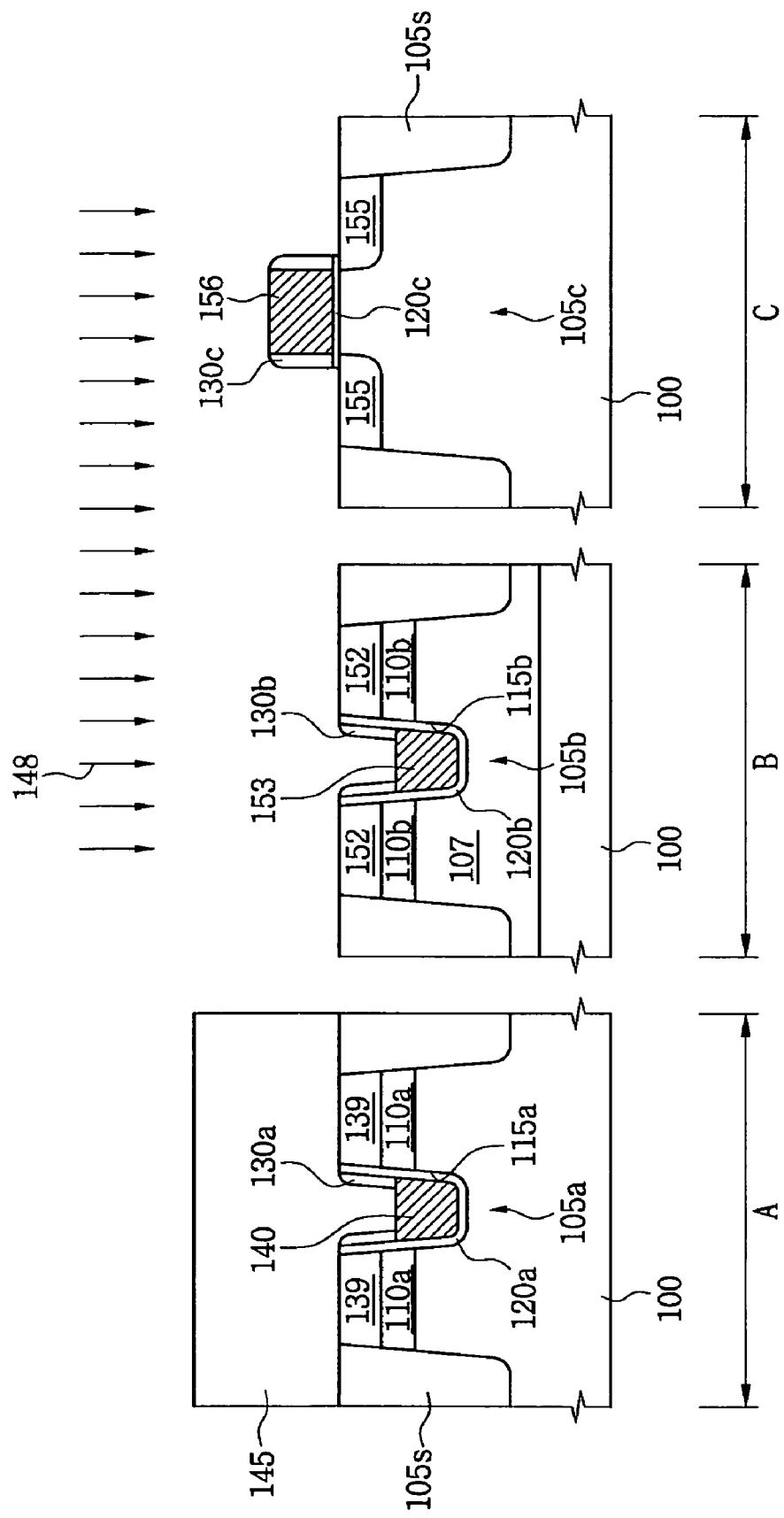

Referring to FIG. 8, the first ion implantation mask (133 of FIG. 7) may be removed. A second ion implantation mask 145 covering the first device region B and exposing the second and third device regions B and C may be formed. The second ion implantation mask 145 may be formed using a photoresist layer.

A second ion implantation process 148 may be performed to implant second impurities into the second and third gate layers (125b and 125c of FIG. 7) exposed by the second ion implantation mask 145 and the second and third active regions 105b and 105c. As a result, second impurity regions 152 may be formed in the second active regions 105b at both sides of the second gate layer (125b of FIG. 7), third impurity regions 155 may be formed in the third active regions 105c at both sides of the third gate layer (125c of FIG. 7), the second gate layer (125b of FIG. 7) may be formed as a high-concentration second gate electrode 153, and the third gate layer (125c of FIG. 7) may be formed as a high-concentration third gate electrode 156.

The second impurity regions 152 and the second gate electrode 153 may be formed to have the same conductivity by the second ion implantation process 148. Bottom regions of the second buffer regions 152 may be formed on a higher level than a top surface of the second gate electrode 153. The second impurity regions 152 may have the same conductivity type as the second buffer regions 110b. In addition, the second impurity regions 152 may have a higher impurity concentration than the second buffer region 110b. The second impurity regions 152 may have a different conductivity type from the first impurity regions 139. The second impurity regions 152 may be defined as a source/drain of the transistor; and the second buffer regions 110b may be defined as an extension part of the source/drain.

The second spacer 130b may prevent or reduce damage to the second gate dielectric layer 120b between the second gate electrode 153 and the second active region 105b during the second ion implantation process 148. The second ion implantation process 148 may be performed after performing the first ion implantation process (136 of FIG. 7). Alternatively, the second ion implantation process 148 may be performed before performing the first ion implantation process (136 of FIG. 7). That is, the first and second impurity regions 139 and 152 may be formed using separate ion implantation processes regardless of sequences of the processes.

Figure 9:
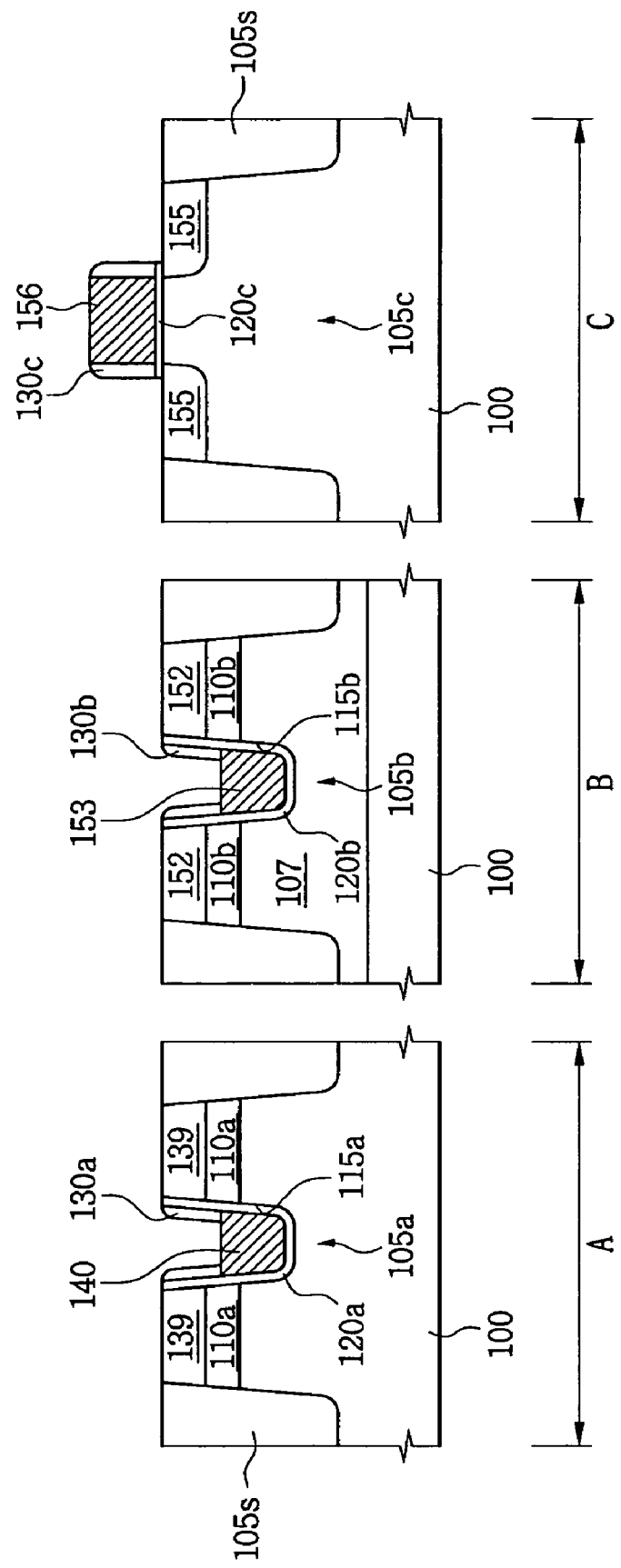

Referring to FIG. 9, the second ion implantation mask (145 of FIG. 8) may be removed. Therefore, a first MOS transistor including the first impurity regions 139, the first buffer region 110a, the first gate dielectric layer 120a and the first gate electrode 140 may be formed in the first device region A. Likewise, a second MOS transistor including the second impurity regions 152, the second buffer region 110b, the second gate dielectric layer 120b and the second gate electrode 153 may be formed in the second device region B. When the first MOS transistor is formed of an NMOS transistor, the second MOS transistor may be formed of a PMOS transistor. In contrast, when the first MOS transistor is formed of a PMOS transistor, the second MOS transistor may be formed of an NMOS transistor.

The first and second gate electrodes 140 and 153 may be formed by implanting impurities into the first and second gate layers 125a and 125b partially filling the first and second gate trenches 115a and 115b. Therefore, the first and second MOS transistors formed in the first and second device regions A and B may be scaled down, and the lengths of channels of the first and second MOS transistors may be increased.

As illustrated in FIG. 9, a top surface of the first gate electrode 140 may be disposed at a lower level than a bottom region of the first impurity region 139. Further, the first impurity region 139 may have the same conductivity type as the first buffer region 110a, and have a higher impurity concentration than the first buffer region 110a. Moreover, the first impurity region 139 may be disposed at a higher level than the first buffer region 110a. Therefore, when the first MOS transistor formed in the first device region A is used as a high-voltage transistor, leakage current caused by a gate induced drain leakage (GIDL) phenomenon of the first MOS transistor may be reduced since the first gate electrode 140 is disposed at a lower level than the first impurity region 139. Further, breakdown voltage, e.g., drain breakdown voltage, of the first MOS transistor used as a high-voltage transistor may be improved. Like the first MOS transistor, the second MOS transistor formed in the second device region B may be used as a high-voltage MOS transistor capable of increasing breakdown voltage.

One of the first and second MOS transistors formed in the first and second device regions A and B may be formed of an NMOS transistor, and the other may be formed of a PMOS transistor. The first and second electrodes 140 and 153 of the first and second MOS transistors may exhibit different conductivity types from each other. That is, a gate electrode of the NMOS transistor may be formed to be an N-type, and a gate electrode of the PMOS transistor may be formed to be a P-type using a process for forming a source/drain 139 and 152 without a separate process for forming a dual gate.

According to example embodiments of the inventive concepts, a gate electrode of a high-voltage transistor can be buried in a gate trench. As a result, an area occupied by the high-voltage transistor can be minimized or reduced, and thus, integration density of a semiconductor device can be improved. Also, high-concentration source/drain regions and a gate electrode can be formed using the same ion implantation process. Therefore, a dual gate can be formed using an ion implantation process for forming the source/drain without a separate process for differentiating conductivity types of gate electrodes of NMOS and PMOS transistors.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of fabricating a semiconductor device, comprising:
    forming a first gate trench in a first active region of a semiconductor substrate;
    forming a first gate layer partially filling the first gate trench;
    forming a spacer insulating layer on the entire surface of the semiconductor substrate having the first gate layer; and
    etching the spacer insulating layer to form a first spacer on an upper sidewall of the first gate trench and expose at least a portion of a top surface of the first gate layer in the first gate trench; and
    after etching the spacer insulating layer, first implanting ions in the first gate layer and in the first active region on both sides of the first gate layer such that (1) the first gate layer becomes a first gate electrode of a first conductivity type and (2) first impurity regions of the first conductivity type are formed on both sides of the first gate electrode.

2. The method of claim 1, wherein the spacer insulating layer includes at least one of a silicon oxide layer, a silicon oxynitride (SiON) layer and a silicon nitride layer.

3. A method of fabricating a semiconductor device, comprising:
    forming a first gate trench in a first active region of a semiconductor substrate;
    forming a first gate layer partially filling the first gate trench; and
    first implanting ions in the first gate layer and in the first active region on both sides of the first gate layer such that (1) the first gate layer becomes a first gate electrode of a first conductivity type and (2) first impurity regions of the first conductivity type are formed on both sides of the first gate electrode,
    forming a first buffer region in the first active region before forming the first gate trench,
    wherein the first buffer region has the same conductivity type as the first impurity regions and has a lower impurity concentration than the first impurity regions, and
    wherein the first gate trench is formed to penetrate the first buffer region.

4. The method of claim 1, wherein forming the first gate layer comprises:
    forming a first gate layer material on the semiconductor substrate having the first gate trench, the first gate layer material including at least one of a silicon (Si) layer, a germanium (Ge) layer and a SiGe layer; and
    removing at least a portion of the gate layer material.

5. The method of claim 1, wherein the first conductivity type is an N-type or a P-type.

6. A method of fabricating a semiconductor device comprising:
    forming a first gate trench in a first active region of a semiconductor substrate;
    forming a second gate trench in a second active region of the semiconductor substrate while the first gate trench is formed;
    forming a first gate layer partially filling the first gate trench;
    forming a second gate layer partially filling the second gate trench while the first gate layer is formed;
    first implanting ions in the first gate layer and in the first active region on both sides of the first gate layer such that (1) the first gate layer becomes a first gate electrode of a first conductivity type and (2) first impurity regions of the first conductivity type are formed on both sides of the first gate electrode; and second implanting ions in the second gate layer and in the second active region on both sides of the second gate layer such that (1) the second gate layer becomes a second gate electrode of a second conductivity type different from the first gate electrode and (2) second impurity regions of the second conductivity type are formed on both sides of the second gate electrode, wherein the first implanting is performed for simultaneously forming the first gate electrode and the first impurity regions, and wherein the second implanting is performed for simultaneously forming the second gate electrode and the second impurity regions.

7. The method of claim 6, further comprising:
forming an isolation region in the semiconductor substrate to define the first and second active regions before forming the first and second gate trenches.

8. The method of claim 6, further comprising:
forming a first buffer region in the first active region before forming the first and second gate trenches, wherein the first buffer region has the same conductivity type as the first impurity regions and has a lower impurity concentration than the first impurity regions; and
forming a second buffer region in the second active region before or after forming the first buffer region, wherein the second buffer region has the same conductivity type as the second impurity regions and has a lower impurity concentration than the second impurity regions.

9. The method of claim 8, further comprising:
forming a well region in the second active region, the well region having a conductivity type different from the conductivity type of the second buffer region.

10. The method of claim 6, before implanting the ions, the method further comprising:
forming a spacer insulating layer on the entire surface of the semiconductor substrate having the second gate layer; and
forming a second spacer on an upper sidewall of the second gate trench by removing at least a portion of the spacer insulating layer.

11. The method of claim 1, further comprising:
forming a first gate dielectric layer on the semiconductor substrate in the first active region having the first gate trench before forming the first gate layer.

12. The method of claim 3, further comprising:
forming a second gate dielectric layer on the semiconductor substrate in the second active region having the second gate trench before forming the second gate layer.

13. The method of claim 6, further comprising:
forming a third active region in the semiconductor substrate;
forming a third gate layer on the third active region of the semiconductor substrate while the first and second gate layers are formed; and
implanting ions in the third gate layer and in the third active region on both sides of the third gate layer such that (1) the third gate layer becomes a third gate electrode and (2) third impurity regions are formed on both sides of the third gate electrode.

14. The method of claim 13, further comprising:
forming a third gate dielectric layer on the semiconductor substrate in the third active region before forming the third gate layer.

15. The method of claim 13, before implanting the ions, the method further comprising:
forming a spacer insulating layer on the entire surface of the semiconductor substrate having the third gate layer; and
forming a third spacer on sidewalls of the third gate layer by removing at least a portion of the spacer insulating layer.

16. The method of claim 13, further comprising:
forming an isolation region in the semiconductor substrate to define the first, second and third active regions before forming the first and second gate trenches.

17. The method of claim 13, further comprising:
forming a first ion implantation mask configured to cover the second and third active regions and expose the first active region; and
implanting first impurities into the first active region using the first ion implantation mask as a photoresist.

18. The method of claim 13, further comprising:
forming a second ion implantation mask configured to cover the first active region and expose the second and third active regions; and
implanting second impurities into the second and third active regions using the second ion implantation mask as a photoresist.

19. The method of claim 1, wherein the semiconductor substrate is made of silicon.

* * * * *